United States Patent
Jeong et al.

(10) Patent No.: US 12,381,097 B2
(45) Date of Patent: Aug. 5, 2025

(54) SUBSTRATE TREATING APPARATUS

(71) Applicant: SEMES CO., LTD., Chungcheongnam-do (KR)

(72) Inventors: Ji Hoon Jeong, Hwaseong-si (KR); Won-Geun Kim, Goyang-si (KR); Young Dae Chung, Incheon (KR); Tae Shin Kim, Suwon-si (KR); Jee Young Lee, Suwon-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 851 days.

(21) Appl. No.: 17/399,153

(22) Filed: Aug. 11, 2021

(65) Prior Publication Data

US 2022/0055074 A1 Feb. 24, 2022

(30) Foreign Application Priority Data

Aug. 24, 2020 (KR) .................. 10-2020-0106456

(51) Int. Cl.
| | |
|---|---|
| *H01L 21/67* | (2006.01) |
| *B08B 3/10* | (2006.01) |
| *B08B 7/00* | (2006.01) |
| *B23K 26/352* | (2014.01) |
| *G02B 3/06* | (2006.01) |

(52) U.S. Cl.
CPC .......... *H01L 21/67098* (2013.01); *B08B 3/10* (2013.01); *B08B 7/0042* (2013.01); *B23K 26/352* (2015.10); *G02B 3/06* (2013.01)

(58) Field of Classification Search
CPC .. B08B 3/10; H01L 21/67098; H01L 21/6704
See application file for complete search history.

(56) References Cited

U.S. PATENT DOCUMENTS

| | | | | |
|---|---|---|---|---|
| 3,432,766 A | * | 3/1969 | Morantz | ................. H01S 3/093 |
| | | | | 359/728 |
| 9,079,355 B2 | * | 7/2015 | El-Siblani | ............. B29C 64/264 |

FOREIGN PATENT DOCUMENTS

| | | |
|---|---|---|
| JP | 2013-153061 A | 8/2013 |
| JP | 5294916 B2 | 9/2013 |
| JP | 2014-515501 A | 6/2014 |
| KR | 1020150136216 A | 12/2015 |

(Continued)

OTHER PUBLICATIONS

Machine Translation KR20200036145A, dated Jun. 2, 2020. (Year: 2020).*

(Continued)

*Primary Examiner* — Michael E Barr
*Assistant Examiner* — Kevin G Lee
(74) *Attorney, Agent, or Firm* — Li & Cai Intellectual Property (USA) Office

(57) ABSTRACT

The present disclosure provides a substrate treating apparatus. The substrate treating apparatus includes a support unit that supports a substrate, and a laser unit that irradiates a laser beam to the substrate supported by the support unit, the laser unit includes an irradiation member that irradiates the laser beam, a lens disposed on a travel path of the laser beam irradiated by the irradiation member to be rotatable, and a reflection member having an inclined surface for changing the travel path of the laser beam that passed through the lens.

7 Claims, 14 Drawing Sheets

(56) References Cited

FOREIGN PATENT DOCUMENTS

KR     1020190037479 A     4/2019
KR     10-2020-0036145 A     4/2020

OTHER PUBLICATIONS

Machine translation of JP5294916B2, dated Sep. 18, 2013. (Year: 2013).*
Korean Patent Office, Office action issued on May 26, 2023.

* cited by examiner

SUBSTRATE TREATING APPARATUS

CROSS-REFERENCE TO RELATED APPLICATIONS

A claim for priority under 35 U.S.C. § 119 is made to Korean Patent Application No. 10-2020-0106456 filed on Aug. 24, 2020, in the Korean Intellectual Property Office, the entire contents of which are hereby incorporated by reference.

BACKGROUND

Embodiments of the inventive concept described herein relate to a substrate treating apparatus.

In general, in process of manufacturing flat panel display devices or semiconductors, various processes such as a photoresist coating process, a developing process, an etching process, and an ashing process are performed in a process of treating a glass substrate or a wafer. The processes include a wet cleaning process using chemicals or deionized water and a drying process for drying the chemicals or the deionized water that is left on a surface of a substrate, in order to remove various contaminants attached to the substrate.

In recent years, substrate treating apparatuses that shorten a process time by supplying a treatment liquid to a substrate, and heating the treatment liquid supplied to the substrate or the substrate. An example of the above-described substrate treating apparatus is disclosed in Korean Patent Application Publication No. 2019-0037497. According to the above patent, a laser irradiation unit is controlled to irradiate a laser beam to a substrate, and move a point, at which the laser is irradiated to the substrate. That is, the laser irradiation unit of the substrate treating apparatus of the above patent changes an irradiation location of a laser irradiated to a substrate by changing a laser beam irradiation direction with the laser irradiation unit.

However, when the location, to which the laser beam is irradiated to the substrate, is changed while the laser beam irradiation unit is changed, a cable, such as an optical fiber, and the like, which are connected to the laser irradiation unit, also is rotated together with a head direction of the laser irradiation unit. The high-speed repetitive movement of the cable becomes a big burden on the durable lifespan of the cable and the like.

In order to solve the problem of laying a burden on the durable lifespan of the cable and the like, a measure of fixing the irradiation location of the laser beam and rotating the substrate may be considered. In this case, the substrate has to be rotated rapidly to increase the heating uniformity of the substrate. When the substrate is rotated rapidly, uniform heating is possible. However, the rotational speed of the substrate acts as a factor that influences the flow velocity of the treatment liquid supplied onto the substrate and flowing on the substrate or the thickness of the liquid film formed by the treatment liquid. That is, rapid rotation of the substrate for uniform heating of the substrate becomes a big restriction in development of a process for treating the substrate by supplying the treatment liquid.

Furthermore, according to the above patent, only the laser irradiation direction of the laser irradiation unit is changed but the laser beam itself is not rotated. Accordingly, according to the above patent, it is difficult to apply the measure of heating the substrate by using a laser beam (for example, a laser beam in the p-polarization state) in the polarization state.

For example, according to the above patent, when the laser irradiation unit irradiates the laser beam in the p-polarization state and changes the irradiation location of the laser while changing the irradiation direction of the laser beam, as illustrated in FIG. 1, the polarization direction of the laser beam faces the same direction. This is because only the irradiation location is changed while the beam profile of the laser beam is maintained. With respect to the substrate, the polarization direction of the laser beam irradiated to any point of the substrate faces the center of the substrate and the polarization direction of the laser beam irradiated to another point of the substrate does not face the center of the substrate. That is, when a measure of heating the substrate by using the laser beam in the polarization state is applied to the above patent, the heating conditions at the locations, at which the laser beam is irradiated to the substrate, are all different, and a precise heating control is difficult.

SUMMARY

Embodiments of the inventive concept provide a substrate treating apparatus that may efficiently treat a substrate.

Embodiments of the inventive concept also provide a substrate treating apparatus that may efficiently heat a substrate.

Embodiments of the inventive concept also provide a substrate treating apparatus that may increase a heating uniformity of a substrate.

Embodiments of the inventive concept also provide a substrate treating apparatus that may increase a heating uniformity of a substrate without rotating the substrate.

Embodiments of the inventive concept also provide a substrate treating apparatus that may minimize generation of a deviation in a thickness of a liquid film formed on a substrate.

Embodiments of the inventive concept also provide a substrate treating apparatus that may minimize a burden on a durable lifespan of an optical fiber connected to an irradiation member.

Embodiments of the inventive concept also provide a substrate treating apparatus that may minimize a reflectivity of a laser beam irradiated to a substrate.

The aspect of the inventive concept is not limited thereto, and other unmentioned aspects of the present invention may be clearly appreciated by those skilled in the art from the following descriptions.

The present disclosure provides a substrate treating apparatus. The substrate treating apparatus includes a support unit that supports a substrate, and a laser unit that irradiates a laser beam to the substrate supported by the support unit, the laser unit includes an irradiation member that irradiates the laser beam, a lens disposed on a travel path of the laser beam irradiated by the irradiation member to be rotatable, and a reflection member having an inclined surface for changing the travel path of the laser beam that passed through the lens.

According to an embodiment, a pair of lenses may be provided.

According to an embodiment, the reflection member may be coupled to any one of the pair of lenses.

According to an embodiment, the reflection member may have a conical shape, an upper end of which is truncated.

According to an embodiment, the pair of lenses and the reflection member may be rotated in the same direction about the same axis of rotation.

According to an embodiment, each of the cylindrical lenses has a shape, one surface of which is a planar surface that is flat, and an opposite surface of which is a curved surface.

According to an embodiment, the substrate treating apparatus may further include a controller, and the controller may control the laser unit to move the reflection member upwards and downwards to change an irradiation location of the laser beam irradiated to the substrate.

According to an embodiment, the irradiation member irradiates a laser beam in a p-polarization state.

According to an embodiment, the inclined surface of the reflection member may be inclined such that an incident angle of the laser beam in the p-polarization state, which is irradiated to the substrate, is a Brewster's angle.

According to an embodiment, the substrate treating apparatus may further include a controller, and the controller controls the laser unit to move the reflection member upwards and downwards such that an incident angle of the laser beam is a Brewster's angle.

The present disclosure provides a substrate treating apparatus. The substrate treating apparatus includes a support unit that supports the substrate, a treatment liquid nozzle that supplies a treatment liquid to the substrate supported by the support unit, and a laser unit that irradiates a laser beam to an upper surface of the substrate supported by the support unit, and the laser unit includes an irradiation member that irradiates the laser beam, a cylindrical lens that rotates the laser beam, and a reflection member that reflects the laser beam that passed through the cylindrical lens in a direction that faces an upper surface of the substrate supported by the support unit.

According to an embodiment, a plurality of cylindrical lenses may be provided to be rotatable.

According to an embodiment, the reflection member may have a conical shape, an upper end of which is truncated, and the truncated upper end is coupled to any one of the cylindrical lens.

According to an embodiment, the cylindrical lenses and the reflection member may be rotated in the same direction about the same axis of rotation.

According to an embodiment, a travel path of the laser beam that is input to the cylindrical lenses and the reflection member may be spaced apart from the axis of rotation and may be parallel to the axis of rotation.

According to an embodiment, the irradiation member may irradiate a laser beam in a p-polarization state.

According to an embodiment, the inclined surface of the reflection member that reflects the laser beam may be inclined such that an incident angle of the laser beam in the p-polarization state, which is irradiated to the substrate, is a Brewster's angle.

According to an embodiment, the substrate treating apparatus may further include a controller, and the controller controls the laser unit to move the reflection member upwards and downwards such that an incident angle of the laser beam is a Brewster's angle.

The present disclosure provides a substrate treating apparatus. The substrate treating apparatus includes a support unit that supports the substrate, and a laser unit that irradiates a laser beam in a p-polarization state to the substrate supported by the support unit, and the laser unit includes an irradiation member that irradiates the laser beam in the p-polarization state, a pair of cylindrical lenses disposed on a travel path of the laser beam in the p-polarization state irradiated by the irradiation member, provided to be rotatable, having a shape, one surface of which has a planar surface that is flat and an opposite surface of which has a curved surface, and a reflection member having a conical shape, an upper end of which is truncated, coupled to any one of the pair of cylindrical lenses, and having an inclined surface that reflects the laser beam in the p-polarization state that passed through the cylindrical lenses.

According to an embodiment, the pair of cylindrical lenses and the reflection member may be rotated in the same direction about the same axis of rotation, and a travel path of the laser beam that may be input to the cylindrical lenses and the reflection member may be spaced apart from the axis of rotation and is parallel to the axis of rotation.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
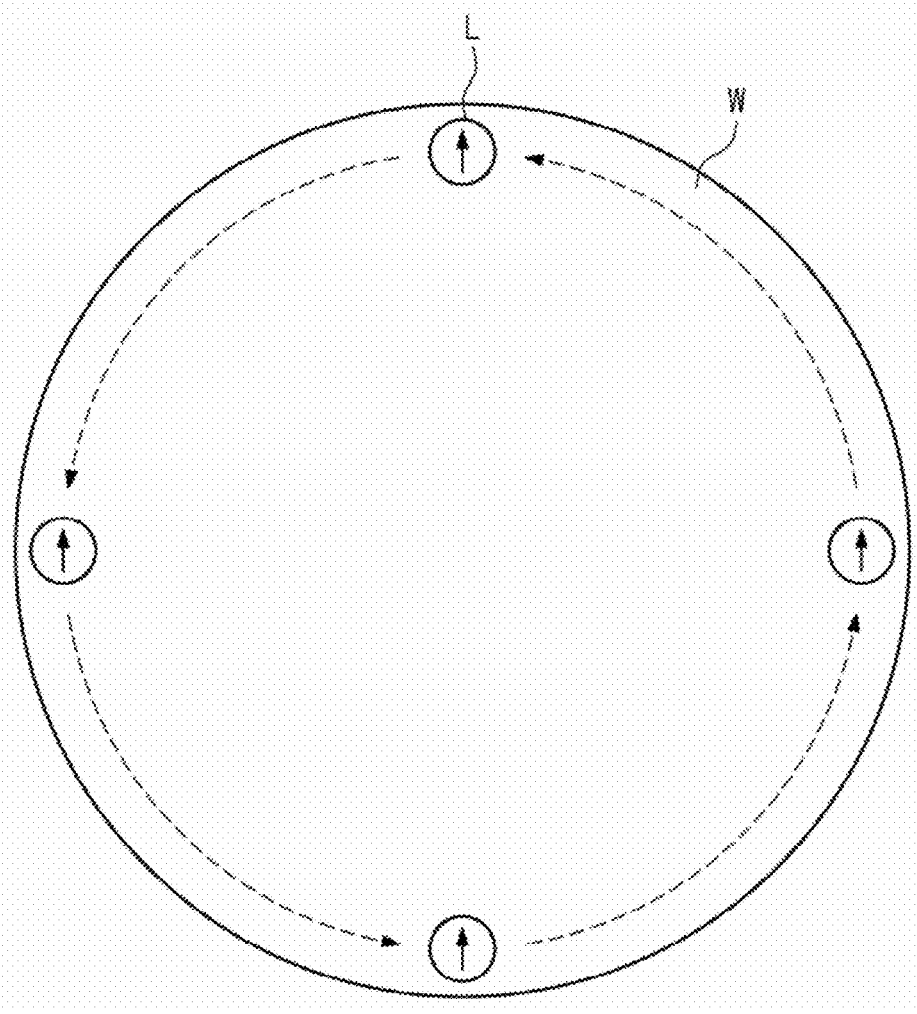
FIG. 1 is a view illustrating a polarization direction of a p-polarized laser beam irradiated onto a substrate when a general laser unit irradiates the laser beam to the substrate.

Hereinafter, exemplary embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. Furthermore, in a description of the embodiments of the inventive concept, a detailed description of related known functions or configurations will be omitted when they make the essence of the inventive concept unnecessarily unclear. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The terms of a singular form may include plural forms unless otherwise specified. Furthermore, in the drawings, the shapes and sizes of the elements may be exaggerated for clearer description.

Hereinafter, embodiments of the inventive concept will be described with reference to FIGS. 2 to 19.

Figure 2:
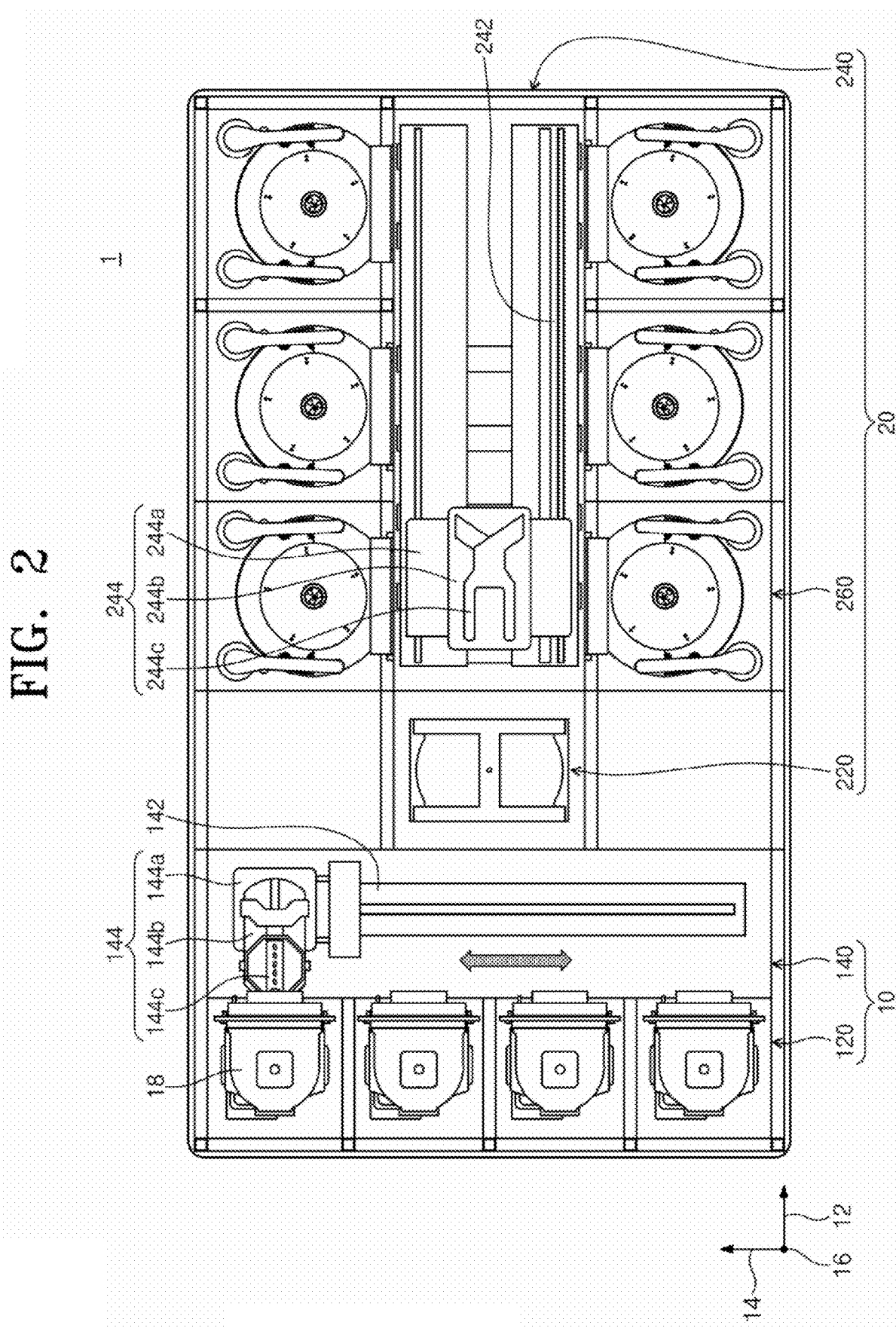
FIG. 2 is a view illustrating a substrate treating apparatus according to an embodiment of the inventive concept.

FIG. 2 is a plan view illustrating a substrate treating apparatus according to an embodiment of the inventive concept. Referring to FIG. 2, a substrate treating apparatus 1 includes an index module 10 and a process executing module 20. The index module 10 includes a plurality of load ports 120 and a feeding frame 140. The load ports 120, the feeding frame 140, and the process executing module 20 may be sequentially arranged in a row. Hereinafter, a direction in which the load ports 120, the feeding frame 140, and the process executing module 20 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 18, in which a substrate "W" is received, is located on the load port 120. The plurality of load ports 120 are provided, and are arranged along the second direction 14 in a row. However, the number of the load ports 120 may be changed according to a condition, such as the process efficiency of the process executing module 20 or a footprint. A plurality of slots (not illustrated) for receiving substrates "W" while the substrates "W" are arranged in parallel to the ground surface are formed in the carrier 18. A front opening unified pod (FOUP) may be used as the carrier 18.

The process executing module 20 includes a buffer unit 220, a feeding chamber 240, and a plurality of process chambers 260. The feeding chamber 240 is disposed such that the lengthwise direction thereof is in parallel to the first direction 12. The process chambers 260 are arranged on opposite sides of the feeding chamber 240. The process chambers 260 are provided on the opposite sides of the feeding chamber 240 to be symmetrical to each other with respect to the feeding chamber 240. The plurality of process chambers 260 are provided on one side of the feeding chamber 240. Some of the process chambers 260 are arranged along the lengthwise direction of the feeding chamber 240. Furthermore, some of the process chambers 260 are arranged to be stacked on each other. That is, the process chamber 260 having an array of "A" by "B" may be arranged on one side of the feeding chamber 240. Here, "A" is the number of the process chambers 260 provided in a row along the first direction 12, and "B" is the number of the process chambers 260 provided in a row along the third direction 16. When four or six process chambers 260 are provided on one side of the feeding chamber 240, the process chambers 260 may be arranged in an array of 2 by 2 or 3 by 2. The number of the process chambers 260 may be changed. Unlike the above-mentioned description, the process chambers 260 may be provided only on one side of the feeding chamber 240. Further, the process chambers 260 may be provided on one side or opposite sides of the feeding chamber 240 to form a single layer.

The buffer unit 220 is disposed between the feeding frame 140 and the feeding chamber 240. The buffer unit 220 provides a space in which the substrates "W" stay before being transported, between the feeding chamber 240 and the feeding frame 140. A plurality of slots (not illustrated) in which the substrates "W" are positioned are provided in the interior of the buffer unit 220. A plurality of slots (not illustrated) may be provided to be spaced apart from each other along the third direction 16. A face of the buffer unit 220 that faces the feeding frame 140 and a face of the buffer unit 220 that faces the feeding chamber 240 are opened.

The feeding frame 140 transports the substrates "W" between the carrier 130 seated on the load port 120 and the buffer unit 220. An index rail 142 and an index robot 144 are provided in the feeding frame 140. The index rail 142 is configured such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is configured to be moved along the third direction 16 on the base 144a. The body 144b is configured to be rotated on the base 144a. The index arms 144c are coupled to the body 144b, and are configured to be moved forwards and rearwards with respect to the body 144b. The plurality of index arms 144c are configured to be driven individually. The index arms 144c are arranged to be stacked so as to be spaced apart from each other along the third direction 16. Some of the index arms 144c are used when the substrates "W" are transported to the carrier 130 in the process executing module 20, and some of the index arms 144c may be used when the substrates "W" are transported from the carrier 130 to the process executing module 20. This structure may prevent particles generated from the substrates "W" before the process treatment from being attached to the substrates "W" after the process treatment in the process of carrying the substrates "W" in and out by the index robot 144.

The feeding chamber 240 transports the substrates "W" between the buffer unit 220 and the process chambers 260, and between the process chambers 260. A guide rail 242 and a main robot 244 are provided in the feeding chamber 240. The guide rail 242 is disposed such that the lengthwise direction thereof is parallel to the first direction 12. The main robot 244 is installed on the guide rail 242, and is linearly moved along the first direction 12 on the guide rail 242. The main robot 244 has a base 244a, a body 244b, and a plurality of main arms 244c. The base 244a is installed to be moved along the guide rail 242. The body 244b is coupled to the base 244a. The body 244b is configured to be moved along the third direction 16 on the base 244a. The body 244b is configured to be rotated on the base 244a. The main arms 244c are coupled to the body 244b, and are configured to be moved forwards and rearwards with respect to the body 244b. The plurality of main arms 244c are configured to be driven individually. The main arms 244c are arranged to be stacked so as to be spaced apart from each other along the third direction 16.

The process chamber 260 performs a cleaning process on the substrate "W". The process chamber 260 may have different structures according to the types of the cleaning processes. Alternatively, the process chambers 260 may have the same structure. Optionally, the process chambers 260 may be divided into a plurality of groups, and the structures of the process chambers 260 pertaining to the same group may be the same and the structures of the process chambers 260 pertaining to the different groups may be different.

Figure 3:
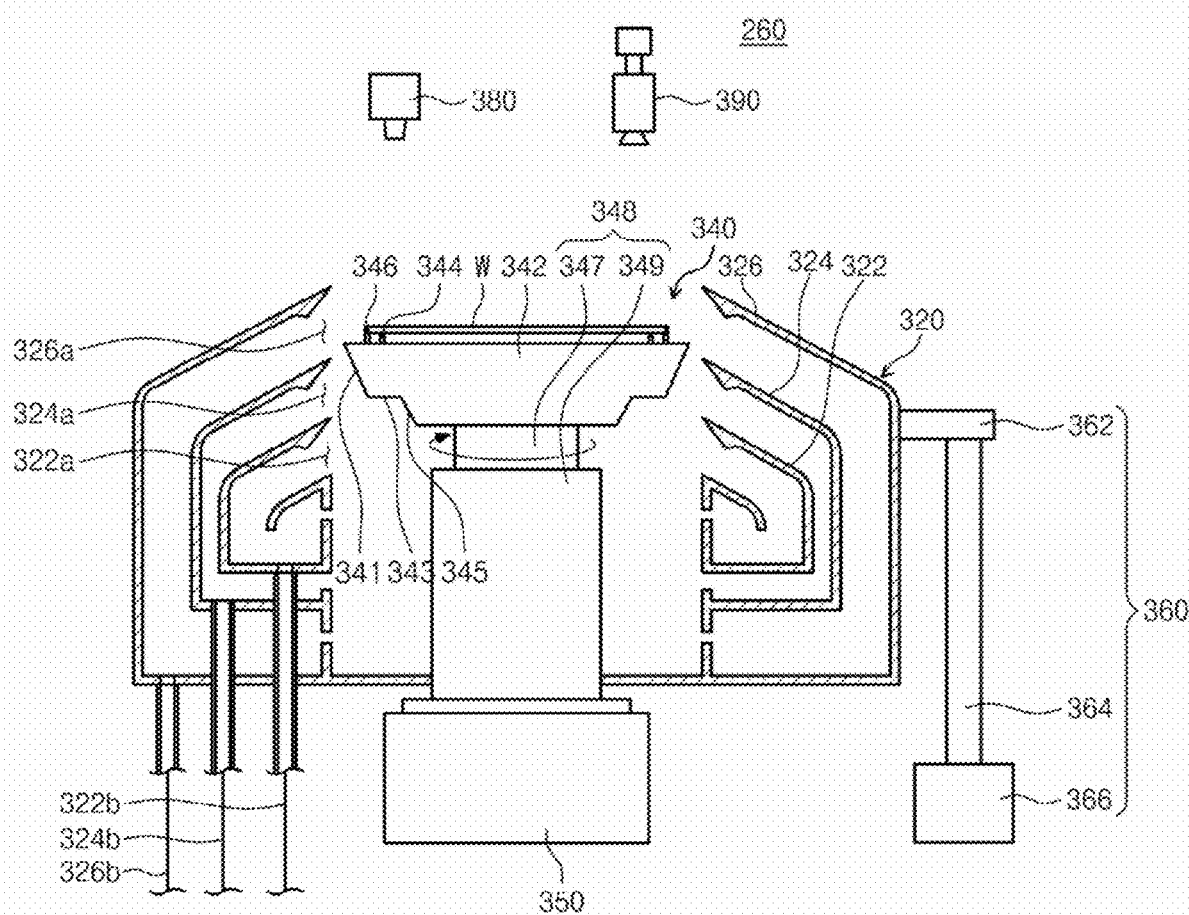
FIG. 3 is a view illustrating an example of a process chamber of FIG. 2.

FIG. 3 is a view illustrating an example of a process chamber of FIG. 2. Referring to FIG. 3, the process chamber 260 includes a bowl 320, a support unit 340, an elevation unit 360, a treatment liquid nozzle 380, a laser irradiation unit 390, and a controller (not illustrated).

A controller (not illustrated), as described below, controls elements of the process chamber 260 such that the components of the process chamber 260 are operated.

The bowl 320 has a treatment space, in which a substrate "W" is treated, in the interior thereof. The bowl 320 has an open-topped vessel shape. The bowl 320 has an inner recovery vessel 322, an intermediate recovery vessel 324, and an outer recovery vessel 326. The recovery vessels 322, 324, and 326 recover different treatment liquids, among the treatment liquids used in the process. The inner recovery vessel 322 is provided to have an annular ring shape that surrounds the support unit 340 when viewed from the top. The intermediate recovery vessel 324 is provided to have an annular ring shape that surrounds the inner recovery vessel 322. The outer recovery vessel 326 is provided to have an annular ring shape that surrounds the intermediate recovery vessel 324. An inner space 322a of the inner recovery vessel 322, a space 324a between the inner recovery vessel 322 and the intermediate recovery vessel 324, and a space 326a between the intermediate recovery vessel 324 and the outer recovery vessel 326 function as inlets, through which the treatment liquid is introduced into the inner recovery vessel 322, the intermediate recovery vessel 324, and the outer recovery vessel 326. According to an embodiment, the inlets may be situated at different heights. Recovery lines 322b, 324b, and 326b are connected to the lower sides of the bottom surfaces of the recovery vessels 322, 324, and 326. The treatment liquids introduced into the recovery vessels 322, 324, and 326 may be provided to an external treatment liquid recycling system (not illustrated) through the recovery lines 322b, 324b, and 326b to be reused.

The support unit 340 supports and rotates the substrate "W" during the process. The support unit 340 includes a spin chuck 342, a plurality of support pins 344, a plurality of chuck pins 346, and a support shaft 348. The spin chuck 342 has an upper surface having a substantially circular shape when viewed from the top. An outer side surface of the spin chuck 342 is stepped. A diameter of a bottom surface of the spin chuck 342 may be smaller than a diameter of an upper surface of the spin chuck 342. The outer side surface of the spin chuck 342 has a first inclined surface 341, a horizontal surface 343, and a second inclined surface 345. The first inclined surface 341 extends downwards from the upper surface of the spin chuck 342. The horizontal surface 343 extends inwards from a lower end of the first inclined surface 341. The second inclined surface 345 extends downwards from an inner end of the horizontal surface 343. The first inclined surface 341 and the second inclined surface 345 faces a downwardly inclined direction as they become closer to the center axis of the body.

The plurality of support pins 344 are provided. The support pins 344 may be arranged to be spaced apart from each other at an edge of the upper surface of the spin chuck 342 and protrude upwards from the spin chuck 342. The support pins 344 are arranged to have a generally annular ring shape through combination thereof. The support pins 344 support an edge of a rear surface of the substrate "W" such that the substrate "W" is spaced apart from the upper surface of the spin chuck 342 by a predetermined distance.

The plurality of chuck pins 346 are provided. The chuck pins 346 are arranged to be more distant from the center of the spin chuck 342 than the support pins 344. The chuck pins 346 are configured to protrude upwards from the spin chuck 342. The chuck pins 346 support a side of the substrate "W" such that the substrate "W" is not separated laterally from a proper place when the support unit 340 is rotated. The chuck pins 346 are provided to be linearly moved between a standby position and a support position along a radial direction of the spin chuck 342. The standby position is a position that is more distant from the center of the spin chuck 342 than the support position. When the substrate "W" is loaded on or unloaded from the support unit 340, the chuck pins 346 are located at the standby position, and when a process is performed on the substrate "W", the chuck pins 346 are located at the support position. The chuck pins 346 are in contact with the side of the substrate "W" at the support position.

The support shaft 348 supports the spin chuck 342 such that the spin chuck 342 is rotatable. The support shaft 348 is located below the spin chuck 342. The support shaft 348 includes a rotary shaft 347 and a fixed shaft 349. The rotary shaft 347 is provided as an inner shaft, and the fixed shaft 349 is provided as an outer shaft. The rotary shaft 347 is provided such that the lengthwise direction thereof faces a third direction. The rotary shaft 347 is fixedly coupled to the bottom surface of the spin chuck 342. The rotary shaft 347 may be rotated by a driver member 350. The spin chuck 342 is provided to be rotated together with the rotary shaft 347. The fixed shaft 349 has a hollow cylindrical shape that surrounds the rotary shaft 347. The fixed shaft 349 is provided to have a diameter that is larger than the diameter of the rotary shaft 347. An inner side surface of the fixed shaft 349 is located to be spaced apart from the rotary shaft 347. The fixed shaft 349 maintains a fixed state while the rotary shaft is rotated.

The elevation unit 360 moves the bowl 320 upwards and downwards. When the bowl 320 is moved upwards and downwards, a relative height of the bowl 320 to the support unit 340 is changed. The elevation unit 360 has a bracket 362, a movement shaft 364, and a driver 366. The bracket 362 is installed on an outer wall of the bowl 320, and the movement shaft 364 that is moved upwards and downwards by the driver 366 is coupled to the bracket 362. The bowl 320 is lowered such that, when the substrate "W" is positioned on the support unit 340 or is lifted from the support unit 340, the bowl 320 is lowered such that the support unit 340 protrudes to the upper side of the bowl 320. When the process is performed, the height of the bowl 320 is adjusted such that the treatment liquid are introduced into the preset recovery vessel 322, 324, 326 according to the kind of the treatment liquid supplied to the substrate "W". Selectively, the elevation unit 360 may move the support unit 340 upwards and downwards.

The treatment liquid nozzle 380 ejects the treatment liquid to the substrate "W". The treatment liquid nozzle 380 may eject the treatment liquid heated to a preset temperature to the substrate "W" to increase the treatment efficiency of the substrate "W". A plurality of treatment liquid nozzles 380 may be provided. The treatment liquid nozzles 380 may supply different kinds of liquids.

The treatment liquid nozzles 380 may be provided such that the locations thereof may be changed. Each of the treatment liquid nozzles 380 may be moved to a process location and a standby location. Here, the process location is a location, at which the treatment liquid nozzle 380 is spaced apart upwards and downwards from the support unit 340 to face the support unit 340, and the standby location is a location, at which the treatment liquid nozzle 380 deviates from the process location. According to an embodiment, the treatment liquid may be a chemical, a rinsing liquid, and an organic solvent. The chemical may be phosphoric acid ($H_3PO_4$). The rinsing liquid may be pure water. The organic solvent may be an isopropyl alcohol (IPA) liquid.

The laser unit 390 may irradiate the laser beam "L" to the substrate "W" supported by the support unit 340. The laser unit 390 may beat the substrate "W" by irradiating the laser beam "L" to the substrate "W". For example, the laser unit 390 may perform SiN stripping, etching, or the like by irradiating the laser beam "L" to the substrate "W". Furthermore, the laser unit 390 may beat a peripheral area of the substrate "W".

Figure 4:
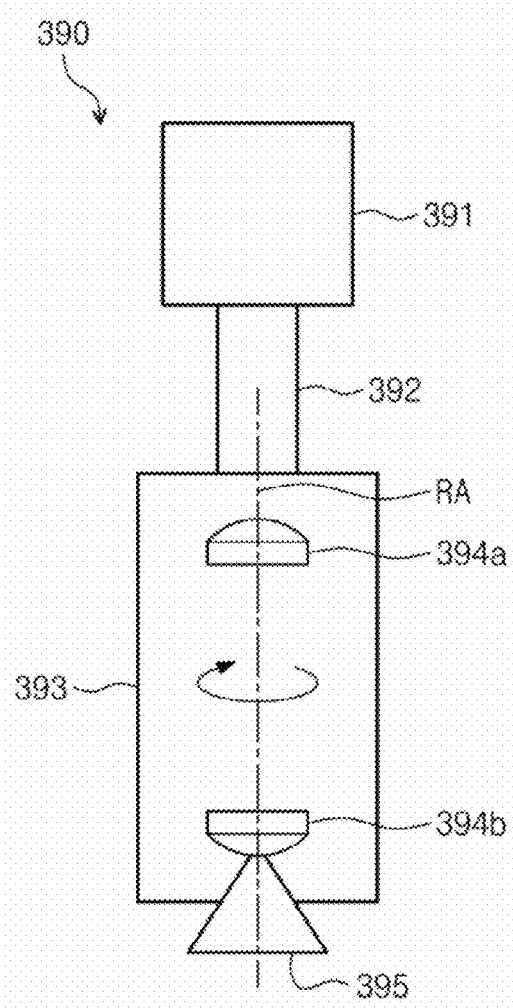
FIG. 4 is a view illustrating a laser unit of FIG. 3.

FIG. 4 is a view illustrating a laser unit of FIG. 3. Referring to FIG. 4, the laser unit 390 may include an irradiation member 391, a delivery member 392, a housing 393, cylindrical lenses 394a and 394b, and a reflection member 395.

The irradiation member 391 may generate a laser beam "L" and irradiate the laser beam "L". The irradiation member 391 may change a wavelength of the laser beam "L". For example, the irradiation member 391 may change the wavelength of the laser beam "L" such that the laser beam "L" has a wavelength having a high absorption rate for the substrate "W". For example, when the substrate "W" is a wafer formed of a material including Si, the irradiation member 391 may generate and irradiate the beam, of which the absorption rate for Si is high.

The laser beam "L" irradiated by the irradiation member 391 may be delivered to the cylindrical lenses 394a and 394b, which will be described below, through the delivery member 392. The delivery member 392 may deliver the laser beam "L" to the cylindrical lenses 394a and 394b. One end of the delivery member 392 may be connected to the irradiation member 391, and an opposite end of the delivery member 392 may be connected to the housing 393, which will be described below. The delivery member 392 may be a vessel, of which one end and an opposite end are opened. Unlike this, the delivery member 392 may be an optical fiber.

The housing 393 may have a space, in which the cylindrical lenses 394a and 394b, which will be described below, are housed. The housing 393 may have a vessel shape. A mechanism (not illustrated) that fixes the cylindrical lenses 394a and 394b, which will be described below, and the reflection member 395, and rotates the cylindrical lenses 394a and 394b and the reflection member 395 may be installed in the housing 393. Furthermore, the housing 393 may be independent from rotation of the pair of cylindrical lenses 394a and 394b, which will be described below, and the reflection members 395. For example, the housing 393 may be fixed while not being rotated, even though the cylindrical lenses 394a and 394b and the reflection members 395 are rotated.

Figure 5:
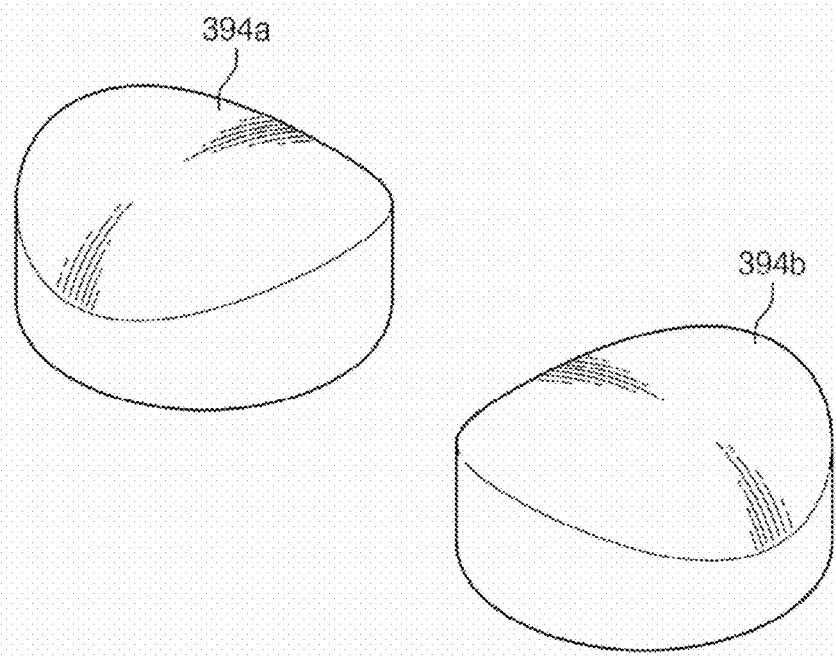
FIG. 5 is a view illustrating cylindrical lenses of FIG. 4.

The cylindrical lenses 394a and 394b may be disposed on a travel path of the laser beam "L" irradiated by the irradiation member 391. Furthermore, the cylindrical lenses 394a and 394b may be provided to be rotatable in one direction by a rotation driver (not illustrated) provided in the housing 393. Accordingly, the cylindrical lenses 394a and 394b may rotate the laser beam "L" that is input to the cylindrical lenses 394a and 394b. The plurality of cylindrical lenses 394a and 394b may be provided. For example, a pair of cylindrical lenses 394a and 394b may be provided. The pair of cylindrical lenses 394a and 394b may be rotated in the same direction about the same axis of rotation RA. Furthermore, as illustrated in FIG. 5, each of the cylindrical lenses 394a and 394b may have a shape, one surface of which has a planar surface that is flat and an opposite surface of which has a curved surface. Referring back to FIG. 4, the planar surface of any one 394a of the pair of cylindrical lenses 394a and 394b and the planar surface of the other 394b of the pair of cylindrical lenses 394a and 394b may face each other. However, the present disclosure is not limited thereto, but the curved surface of any one 394a of the pair of cylindrical lenses 394a and 394b and the planar surface of the other 394b of the pair of cylindrical lenses 394a and 394b may face each other. For example, the curved surfaces of the cylindrical lenses 394a and 394b may face each other.

Figure 6:
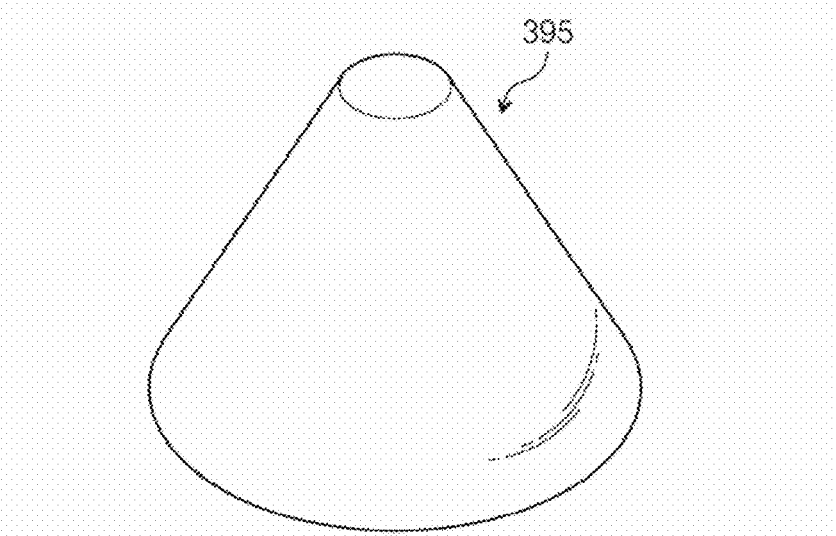
FIG. 6 is a view illustrating a reflection member of FIG. 4.

The reflection member 395 may have an inclined surface that changes the travel path of the laser beam "L" that passed through the cylindrical lenses 394a and 394b. The reflection member 395 may reflect the laser beam "L" that passed through the cylindrical lenses 394a and 394b in a direction that faces the upper surface of the substrate "W" supported by the support unit 340. Furthermore, the reflection member 395 may have a conical shape, an upper end of which is truncated, as illustrated in FIG. 6. Referring back to FIG. 4, the truncated upper end of the reflection member 395 may be coupled to any one 394b of the cylindrical lenses 394a and 394b. For example, the truncated upper end of the reflection member 395 may be coupled to the opposite surface having the curved surface of any one 394b of the cylindrical lenses 394a and 394b.

Furthermore, the reflection member 395 may be rotated together with the pair of cylindrical lenses 394a and 394b. For example, the reflection member 395 may be rotated in the same direction as the rotational direction of the cylindrical lenses 394a and 394b about the same axis of rotation RA. Furthermore, the rotational speed of the cylindrical lenses 394a and 394b may be the same as the rotational speed of the reflection member 395.

Figure 7:
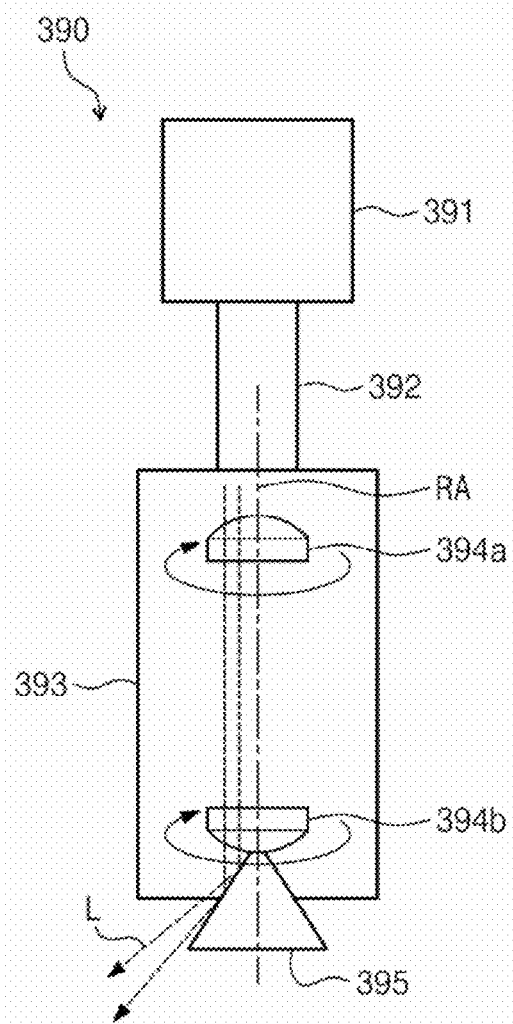
FIG. 7 is a view illustrating a state, in which the laser unit of FIG. 3 irradiates a laser beam.
Figure 8:
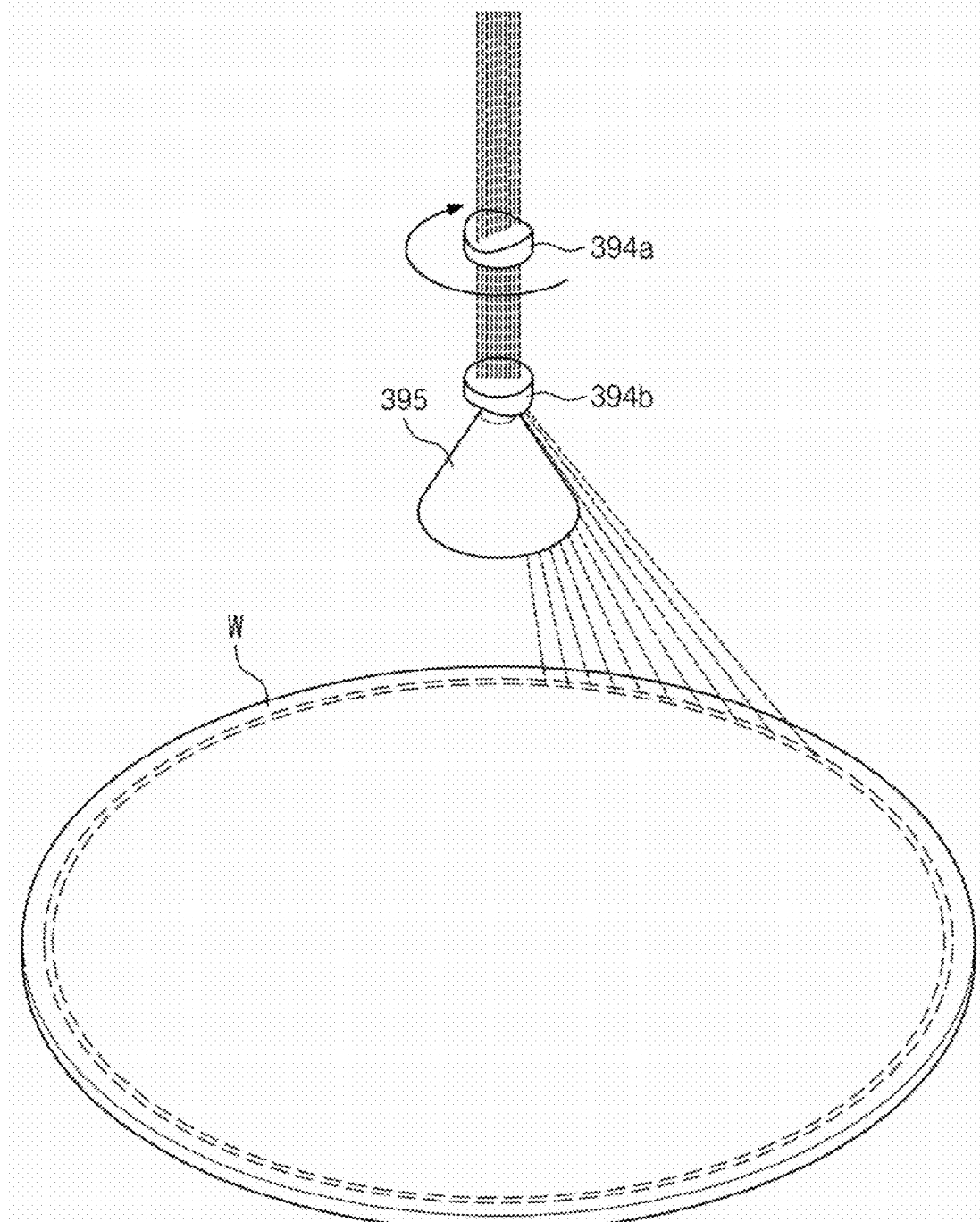
FIG. 8 is a view illustrating a state, in which a laser beam irradiated by the laser unit of FIG. 3 is delivered to the substrate.

FIG. 7 is a view illustrating a state, in which the laser unit of FIG. 3 irradiates a laser beam. FIG. 8 is a view illustrating a state, in which a laser beam irradiated by the laser unit of FIG. 3 is delivered to the substrate. Referring to FIGS. 7 and 8, the laser beam "L" generated and irradiated by the irradiation member 391 may be delivered to the pair of cylindrical lenses 394a and 394b and the reflection member 395. For example, the laser beam "L" generated and irradiated by the irradiation member 391 may be delivered to the reflection member 395 via the pair of cylindrical lenses 394a and 394b, and the laser beam "L" delivered to the reflection member 395 may be reflected by the inclined surface of the reflection member 395 and be delivered to the upper surface of the substrate "W". Furthermore, the travel path of the laser beam "L" input to the pair of cylindrical lenses 394a and 394b and the reflection member 395 may be spaced apart from the axis of rotation RA, and may be parallel to the axis of rotation RA. For example, when viewed from the top, the laser beam "L" may be input to the pair of cylindrical lenses 394a and 394b and the reflection member 395 to the location that is eccentric from the centers of the pair of cylindrical lenses 394a and 394b and the reflection member 395.

The travel path of the laser beam "L" that travels downwards from the top may be reflected by the reflection member 395 and be changed to a downwardly inclined direction. For example, when viewed from the top, the laser unit 390 may irradiate the laser beam "L" in a state in which it is located at the center of the substrate "W". Then, the laser beam "L" input to the substrate "W" may be input to the substrate "W" in a direction that faces a peripheral area of the substrate "W" in a central area of the substrate "W".

Furthermore, the reflection member 395 may have a conical shape, an upper end of which is truncated, as described above. Accordingly, the inclined surface of the reflection member 395 may be deflected. Accordingly, points, at which the laser beam "L" is irradiated to the substrate "W" may have a substantially arc shape when viewed from the top. The inclined surface of the reflection member 395 may be deflected such that the curvature and the radius of curvature of the arc are the same as those of an edge of the substrate "W".

Furthermore, as described above, the pair of cylindrical lenses 394a and 394b and the reflection member 395 may be rotated in the same direction about the same axis of rotation RA. Accordingly, the laser beam "L" that passed through the pair of cylindrical lenses 394a and 394b and was reflected by the reflection member 395 also may be rotated together. Accordingly, points, at which the laser beam "L" is irradiated to the substrate "W" may have a ring shape when viewed from the top. When viewed from the top, the ring formed by the points, at which the laser beam "L" is irradiated to the substrate "W", may have the same center as that of the substrate "W". Furthermore, the inclined surface of the reflection member 395 may be deflected such that the curvature and the radius of curvature of the ring are the same as those of an edge of the substrate "W".

According to the embodiment of the inventive concept, the irradiation member 391, the delivery member 392, and the housing 393 are fixed, and the pair of cylindrical lenses 394a and 394b and the reflection member 395 are rotated. That is, the laser beam "L" may be rotated by rotating the pair of cylindrical lenses 394a and 394b and the reflection member 395 while not rotating the whole laser unit 390. Accordingly, the burden on the durability of the delivery member 392 that may be an optical fiber may be minimized.

Furthermore, as the laser beam "L" is rotated, the heating uniformity of the substrate "W" may be pursued while the substrate "W" is not rotated. That is, according to the embodiment of the inventive concept, the heating uniformity of the substrate "W" may be implemented only through rotation of the cylindrical lenses 394a and 394b and the reflection member 395. Accordingly, the support unit 340 may freely change the rotational speed of the substrate "W" such that the flow velocity of the treatment liquid flowing on the substrate "W" or the thickness of the liquid film formed by the treatment liquid may be a desired flow velocity and a desired thickness.

Figure 9:
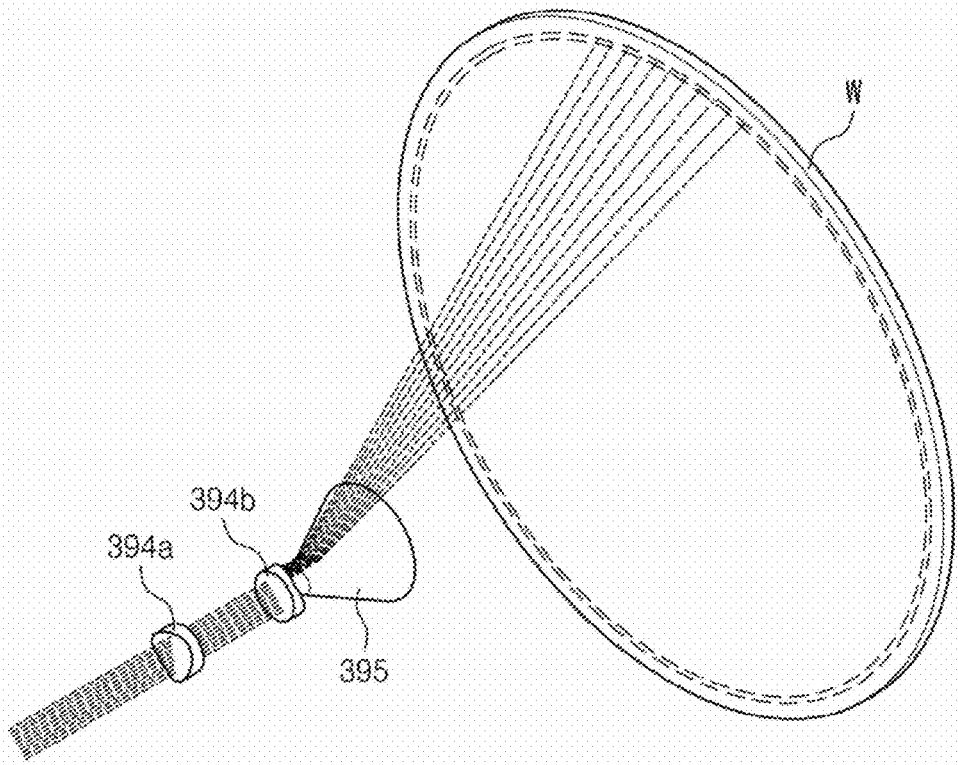
FIG. 9 is a conceptual view illustrating a travel of the laser beam when the cylindrical lenses and the reflection member of the laser unit is rotated by 0 degrees.
Figure 10:
FIG. 10 is a view illustrating the laser beam delivered to the substrate, which is viewed from a top, when the cylindrical lenses and the reflection member of the laser unit is rotated by 0 degrees.
Figure 11:
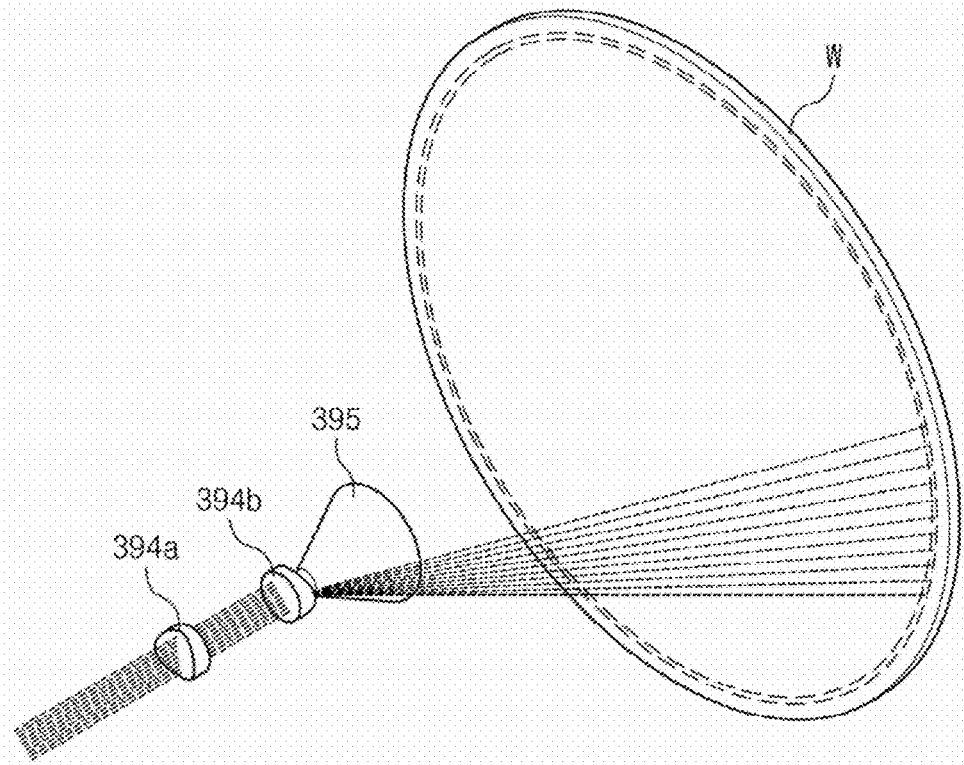
FIG. 11 is a conceptual view illustrating a travel of the laser beam when the cylindrical lenses and the reflection member of the laser unit is rotated by 45 degrees.
Figure 12:
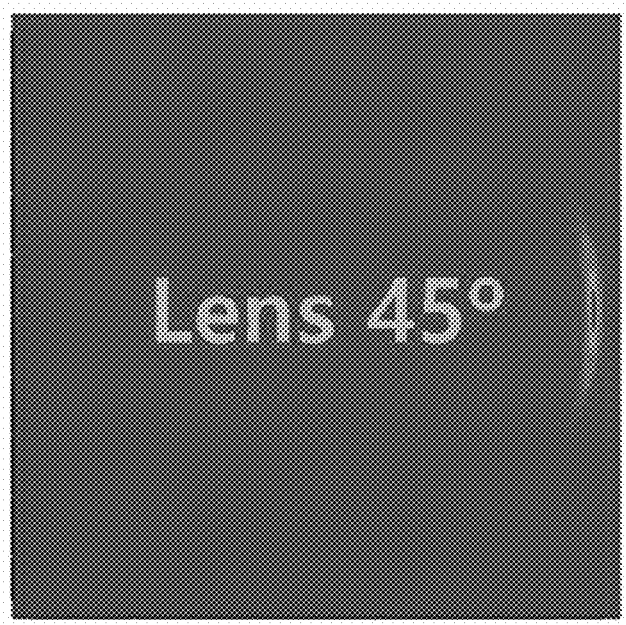
FIG. 12 is a view illustrating the laser beam delivered to the substrate, which is viewed from a top, when the cylindrical lenses and the reflection member of the laser unit is rotated by 45 degrees.
Figure 13:
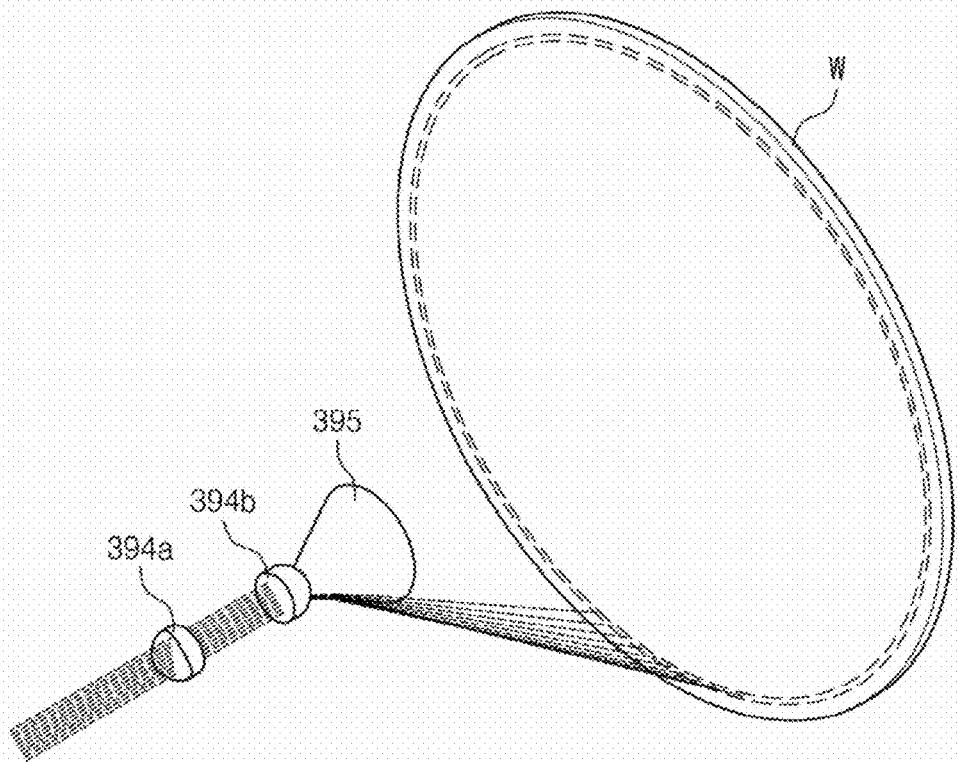
FIG. 13 is a conceptual view illustrating a travel of the laser beam when the cylindrical lenses and the reflection member of the laser unit is rotated by 90 degrees.
Figure 14:
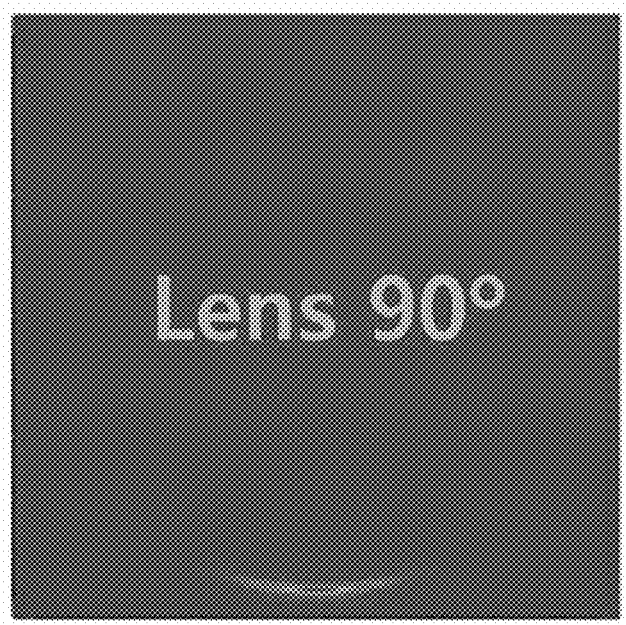
FIG. 14 is a view illustrating the laser beam delivered to the substrate, which is viewed from a top, when the cylindrical lenses and the reflection member of the laser unit is rotated by 90 degrees.
Figure 15:
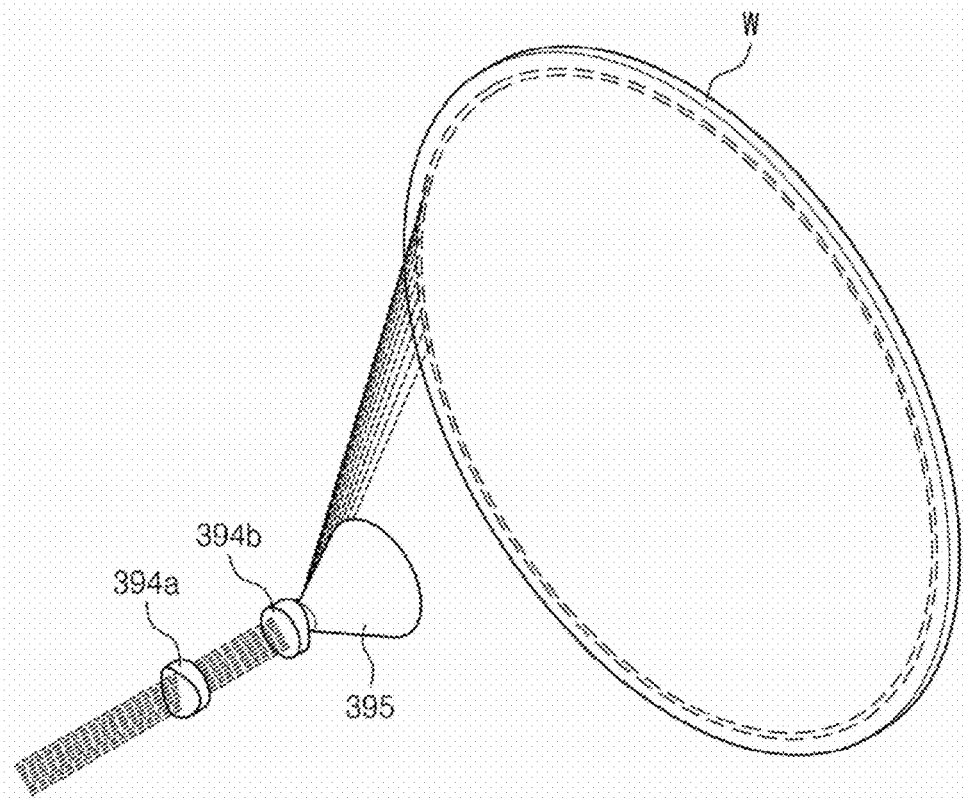
FIG. 15 is a conceptual view illustrating a travel of the laser beam when the cylindrical lenses and the reflection member of the laser unit is rotated by 135 degrees.
Figure 16:
FIG. 16 is a view illustrating the laser beam delivered to the substrate, which is viewed from a top, when the cylindrical lenses and the reflection member of the laser unit is rotated by 135 degrees.

FIGS. 9 to 16 illustrate a travel path of a laser beam "L" and the laser beam "L" delivered to the substrate "W" according to an angle, by which the cylindrical lenses 394a and 394b and the reflection member are rotated, when viewed from the top. As may be seen with reference to FIGS. 9 to 16, the laser beam "L" is rotated by two cycles when the cylindrical lenses 394a and 349b are rotated by one cycle because the pair of cylindrical lenses 394a and 394b are provided. For example, FIG. 9 illustrates a travel of the laser beam "L" when the cylindrical lenses 394a and 394b are rotated by 0 degrees. FIG. 10 illustrates the laser beam "L" delivered to the substrate "W" when the cylindrical lenses 394a and 394b are rotated by 0 degrees. Furthermore, FIG. 11 illustrates a travel of the laser beam "L" when the cylindrical lenses 394a and 394b are rotated by 45 degrees. FIG. 12 illustrates the laser beam "L" delivered to the substrate "W" when the cylindrical lenses 394a and 394b are rotated by 45 degrees. As may be seen in comparison of FIGS. 10 and 12, it may be identified that the irradiation location of the laser beam "L" is rotated by 90 degrees when the cylindrical lenses 394a and 394b are rotated by 45 degrees. Similarly, referring to FIGS. 13 and 14, it may be identified that the irradiation location of the laser beam "L" is rotated by 180 degrees when the cylindrical lenses 394a and 394b are rotated by 90 degrees. Further, referring to FIGS. 15 and 16, it may be identified that the irradiation location of the laser beam "L" is rotated by 270 degrees when the cylindrical lenses 394a and 394b are rotated by 135 degrees. This is because the pair of cylindrical lenses 394a and 394b are provided.

That is, according to the embodiment of the inventive concept, the rotational speed of the laser beam "L" corresponds to two times of the rotational speeds of the cylindrical lenses 394a and 394b. Further, the heating uniformity of the substrate "W" may be increased as the rotational speed of the laser beam "L" irradiated to the substrate "W" becomes higher. That is, according to the inventive concept, even though the cylindrical lenses 394a and 394b are rotated at a lower RPM, the laser beam "L" may be rotated fast, whereby the heating uniformity of the substrate "W" may be pursued with more certainty.

Figure 17:
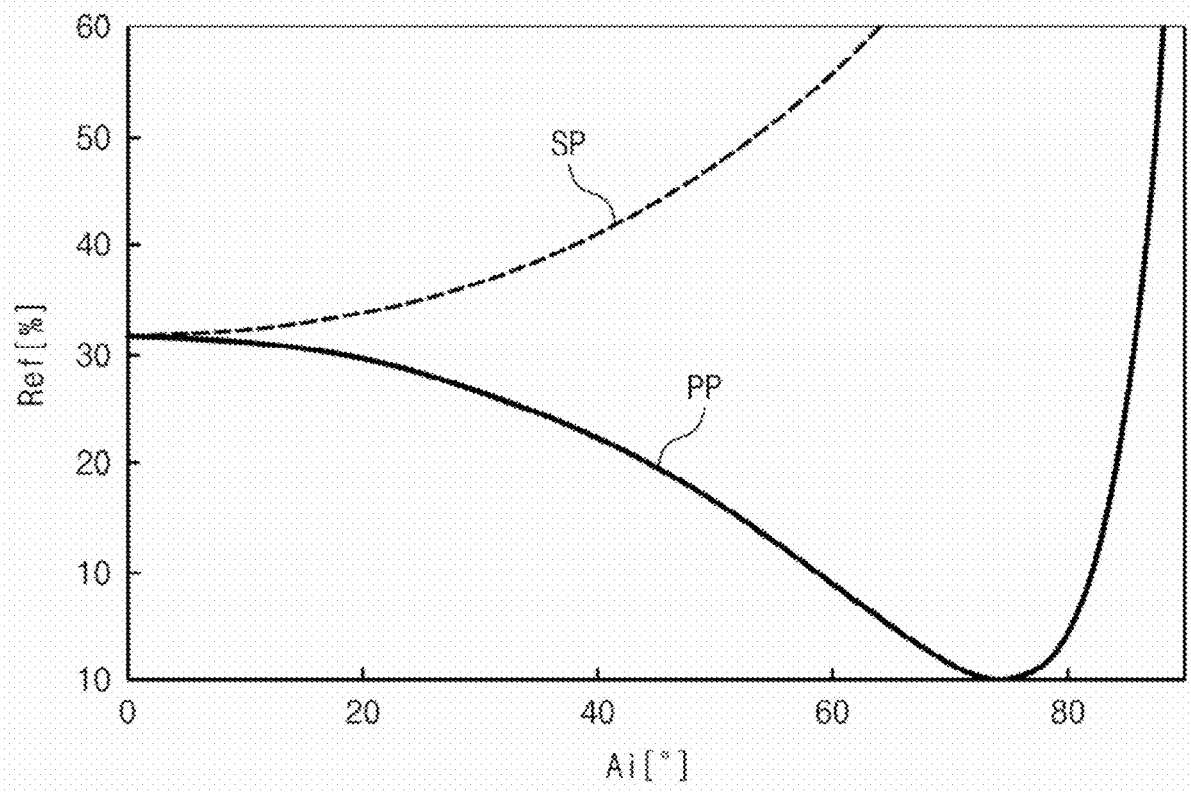
FIG. 17 is a view illustrating an example of a reflectivity of a surface of the substrate according to a polarization state and an incident angle of the laser beam.

FIG. 17 is a view illustrating an example of a reflectivity of a surface of the substrate according to a polarization state and an incident angle of the laser beam. Further, FIG. 17 illustrates a reflectivity of a surface of the substrate "W" according to an incident angle Ai of the laser beam "L" to the substrate "W" when the polarization state of the laser beam "L" is an s-polarization (S-pol, SP). Further, FIG. 17 illustrates a reflectivity (Ref) of a surface of the substrate "W" according to an incident angle Ai of the laser beam "L" to the substrate "W" when the polarization state of the laser beam "L" is a p-polarization (P-pol, PP). As the surface reflectivity of the substrate "W" increases, the laser beam "L" is lost while not being used to heat the substrate "W".

That is, in order to increase the heating efficiency of the substrate "W", the surface reflectivity Ref of the substrate "W" has to be lowered.

Referring to FIG. 17, it can be seen that the reflectivity of the laser beam "L" in the p-polarization state for the substrate "W" is lower than that of the laser beam "L" in the s-polarization state by properly adjusting the incidence angle Ai to the substrate "W". In particular, an angle corresponding to a reflectivity of 0% for the substrate "W" is present in the laser beam "L" in the p-polarization state, and the angle corresponds to a Brewster's angle (or a polarization angle).

As described above, it is difficult to apply the laser beam in the p-polarization state to the substrate when a general laser unit is used. When only the irradiation direction of the laser beam is changed while the laser beam itself is not rotated, only the irradiation location is changed while the beam profile of the laser beam is maintained. Accordingly, the polarization direction of the laser beam irradiated to any point of the substrate faces the center of the substrate, and the polarization direction of the laser beam irradiated to another point of the substrate does not face the center of the substrate. That is, when the laser beam in the p-polarization state is applied to the general laser unit, the heating conditions are different for the locations of the substrate, to which the laser beam is irradiated, whereby it is difficult to uniformly heat the substrate.

Figure 18:
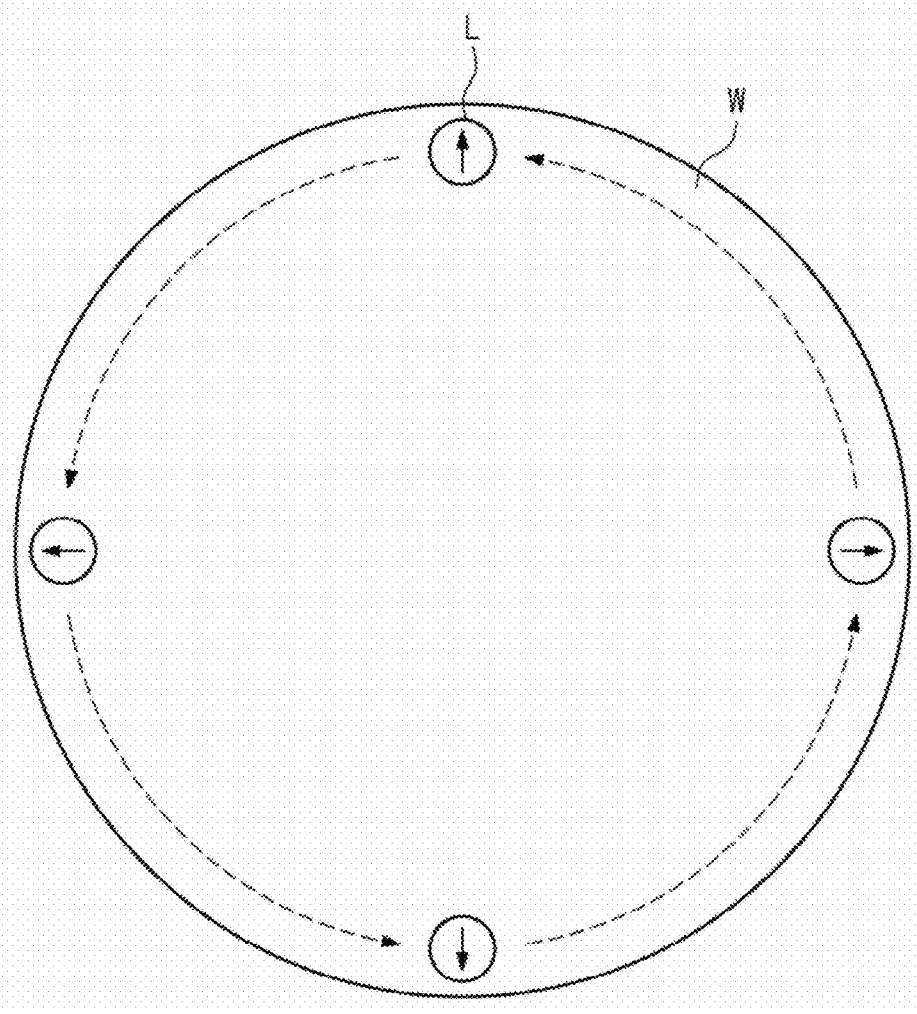
FIG. 18 is a view illustrating a polarization direction of a p-polarized laser beam irradiated onto a substrate when a laser unit irradiates the laser beam to the substrate according to the inventive concept.

However, according to the embodiment of the inventive concept, the laser beam "L" also is rotated together as the cylindrical lenses 394a and 394b are rotated. Accordingly, the beam profile of the laser beam "L" also is rotated together. Accordingly, as illustrated in FIG. 18, when the irradiation member 391 irradiates the laser beam "L" in the p-polarization state, the polarization direction of the laser beam "L" irradiated to any point of the substrate "W" is symmetrical to the polarization direction of the laser beam "L" irradiated to another point of the substrate "W" with respect to the center of the substrate "W". That is, when the laser unit 390 of the inventive concept heats the substrate "W" by using the laser beam "L" in the p-polarization state, the substrate "W" may be uniformly heated in the same heating condition even through the location of the substrate "W", to which the laser beam "L" is irradiated, is changed. That is, the inventive concept may apply the laser beam "L" in the p-polarization state. As described above, the reflectivity of the laser beam "L" in the p-polarization state to the substrate "W" is generally low. Accordingly, according to the embodiment of the inventive concept, the heating efficiency of the substrate "W" may be increased.

Furthermore, an example of irradiating of the laser beam "L" in the p-polarization state by the above-described irradiation member 391 may include an example of generating a laser beam "L" in a p-polarization state by the irradiation member 391, or generating a laser beam "L" in a non-polarization state by the irradiation member 391 and inputting the laser beam "L" in the non-polarization state to the cylindrical lenses 394a and 394b after the laser beam "L" in the non-polarization passes through the polarization lenses installed at front ends of the cylindrical lenses 394a and 394b.

Furthermore, as described above, the reflectivity of the laser beam "L" irradiated to the substrate "W" may be changed according to the incidence angle Ai of the laser beam "L" input to the substrate "W". In particular, when the incidence angle Ai of the laser beam "L" corresponds to the Brewster's angle, the theoretical reflectivity corresponds to 0%.

Figure 19:
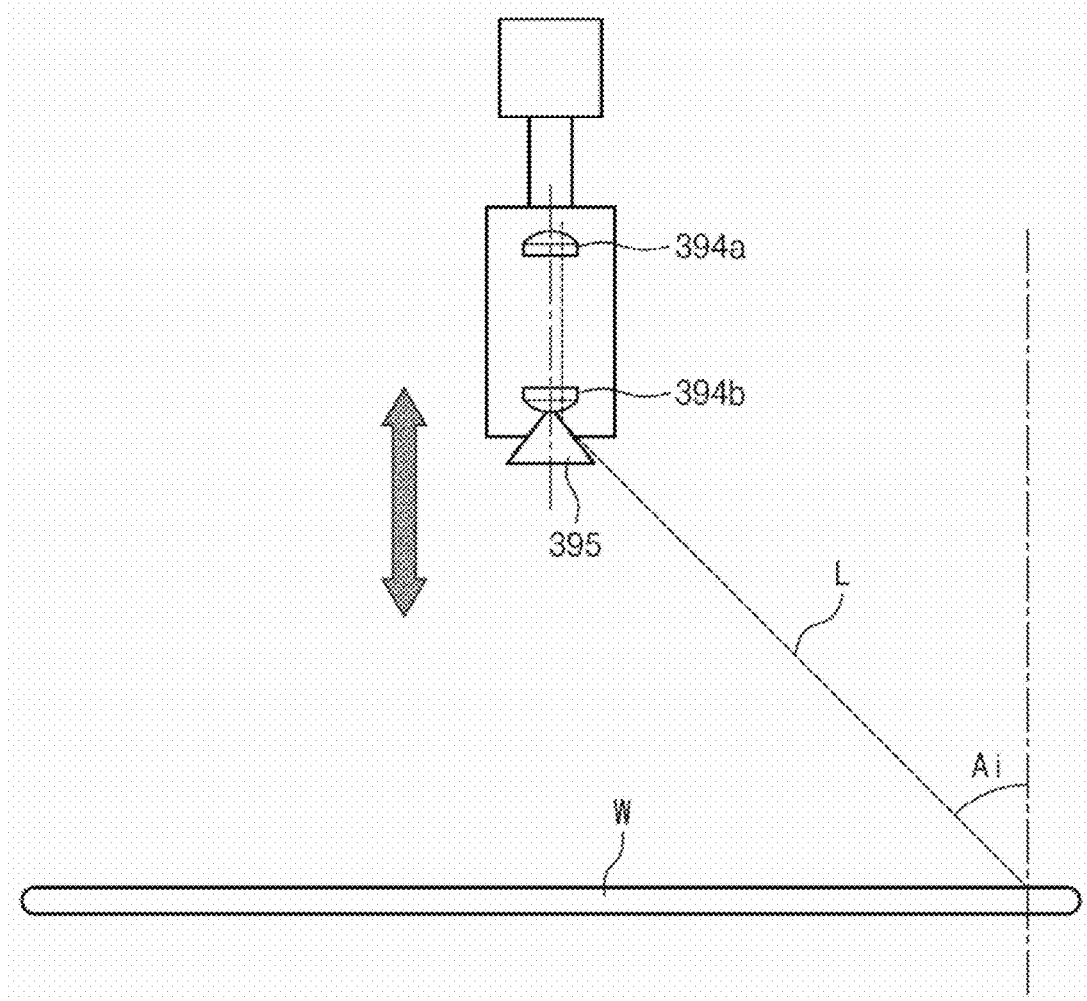
FIG. 19 is a view illustrating a state, in which the laser unit irradiates a laser beam to the substrate according to the inventive concept.

The controller (not illustrated) of the inventive concept may control the laser unit 390. For example, as illustrated in FIG. 19, the controller may change the location of the laser unit 390. For example, the controller may change the incidence angle Ai of the laser beam "L" irradiated to the substrate "W" by moving the pair of cylindrical lenses 394a and 394b and the reflection member 395 of the laser unit 390 upwards and downwards. Furthermore, the controller may set the incident angle Ai of the laser beam "L" to the Brewster's angle by moving the pair of cylindrical lenses 394a and 394b and the reflection member 395 upwards and downwards. Furthermore, the inclined surface of the reflection member 395 of the inventive concept may be inclined such that the incident angle Ai of the laser beam "L" in the p-polarization angle, which is irradiated to the substrate "W" becomes the Brewster's angle. That is, the incidence angle Ai of the laser beam "L" may be adjusted according to the distance between the reflection member 395 and the substrate "W" and/or the change in the angle of the inclined surface of the reflection member 395.

For example, the controller may change the irradiation location of the laser beam "L" irradiated to the substrate "W" by moving the pair of cylindrical lenses 394a and 394b and the reflection member 395 of the laser unit 390 upwards and downwards. As described above, the points, at which the laser beam "L" is irradiated to the substrate "W" form a ring shape having substantially the same center as that of the substrate "W", and the diameter of the ring may be changed when the cylindrical lenses 394a and 394b and the reflection member 395 are moved upwards and downwards.

According to an embodiment of the inventive concept, the substrate may be efficiently treated.

Further, according to an embodiment of the inventive concept, the substrate may be efficiently heated.

Furthermore, according to an embodiment of the inventive concept, the heating uniformity of the substrate may be increased.

Furthermore, according to an embodiment of the inventive concept, the heating uniformity of the substrate may be increased while the substrate is not rotated.

Furthermore, according to an embodiment of the inventive concept, generation of a deviation in the thickness of the liquid film formed on the substrate may be minimized.

Furthermore, according to an embodiment of the inventive concept, a burden on a durable lifespan of an optical fiber connected to an irradiation member may be minimized.

Further, according to an embodiment of the inventive concept, a reflectivity of a laser beam irradiated to a substrate may be minimized.

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
a support unit configured to support a substrate; and
a laser unit configured to irradiate a laser beam to the substrate supported by the support unit,
wherein the laser unit includes:
an irradiation member configured to irradiate the laser beam;
a housing coupled to the irradiation member;
a lens disposed in the housing and on a travel path of the laser beam irradiated by the irradiation member; and
a reflection member having an inclined surface for changing the travel path of the laser beam that passed through the lens;
wherein the lens and the reflection member are rotatable, and the irradiation member and the housing are fixed;
wherein a pair of lenses are provided;
wherein the reflection member is coupled to any one of the pair of lenses;
wherein the reflection member has a conical shape, an upper end of which is truncated.

2. The substrate treating apparatus of claim 1, wherein the pair of lenses and the reflection member are rotated in the same direction about the same axis of rotation.

3. The substrate treating apparatus of claim 1, wherein each of the cylindrical lenses has a shape, one surface of which is a planar surface that is flat, and an opposite surface of which is a curved surface.

4. The substrate treating apparatus of claim 1, further comprising:
a controller,
wherein the controller controls the laser unit to move the reflection member upwards and downwards to change an irradiation location of the laser beam irradiated to the substrate.

5. The substrate treating apparatus of claim 1, wherein the irradiation member irradiates a laser beam in a p-polarization state.

6. The substrate treating apparatus of claim 5, wherein the inclined surface of the reflection member is inclined such that an incident angle of the laser beam in the p-polarization state, which is irradiated to the substrate, is a Brewster's angle.

7. The substrate treating apparatus of claim 5, further comprising:
a controller,
wherein the controller controls the laser unit to move the reflection member upwards and downwards such that an incident angle of the laser beam, which is irradiated to the substrate, is a Brewster's angle.

* * * * *